US008670219B2

(12) United States Patent
Disney

(10) Patent No.: US 8,670,219 B2
(45) Date of Patent: Mar. 11, 2014

(54) HIGH-VOLTAGE DEVICES WITH INTEGRATED OVER-VOLTAGE PROTECTION AND ASSOCIATED METHODS

(75) Inventor: Donald R. Disney, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 245 days.

(21) Appl. No.: 13/162,512

(22) Filed: Jun. 16, 2011

(65) Prior Publication Data

US 2012/0320476 A1    Dec. 20, 2012

(51) Int. Cl.
*H02H 9/00*    (2006.01)
*H02H 3/20*    (2006.01)
*H02H 9/04*    (2006.01)

(52) U.S. Cl.
USPC ............................................. 361/56; 361/91.1

(58) Field of Classification Search
USPC ............................................................ 361/56
See application file for complete search history.

(56) References Cited

U.S. PATENT DOCUMENTS

| 6,956,359 | B2 * | 10/2005 | Dubhashi | 323/282 |
| 7,952,488 | B1 * | 5/2011 | Zansky et al. | 340/693.1 |
| 8,422,180 | B2 * | 4/2013 | Lin et al. | 361/56 |
| 2008/0013233 | A1 * | 1/2008 | Otake et al. | 361/56 |
| 2011/0149449 | A1 * | 6/2011 | Lin et al. | 361/56 |

OTHER PUBLICATIONS

Nakamura Masaru; Switching power supply device; Publication No. 2012-249524; Abstract, Figure, Specification.*

* cited by examiner

*Primary Examiner* — Dharti Patel
(74) *Attorney, Agent, or Firm* — Perkins Coie LLP

(57) ABSTRACT

The present technology discloses a high-voltage device comprising a high-voltage transistor and an integrated over-voltage protection circuit. The over-voltage protection circuit monitors a voltage across the high-voltage transistor to detect an over-voltage condition of the high-voltage transistor, and turns the high-voltage transistor ON when the over-voltage condition is detected. Thus, once the high-voltage transistor is in over-voltage condition, the high-voltage transistor is turned ON and can dissipate the power from the over-voltage event through its channel.

15 Claims, 4 Drawing Sheets

HIGH-VOLTAGE DEVICES WITH INTEGRATED OVER-VOLTAGE PROTECTION AND ASSOCIATED METHODS

TECHNICAL FIELD

This disclosure relates generally to high-voltage semiconductor devices, and particularly relates to high-voltage transistors.

BACKGROUND

High-voltage (HV) transistors are broadly utilized as switches in power supplies (e.g., AC/DC converters) for industrial and consumer electronics. In such applications, input voltages may be very high, for example from 500V to 1000V. Thus, high-voltage transistors need to have high breakdown voltages to withstand such high input voltages.

Many high-voltage transistors are designed as vertical transistors in which a direction of current flow is into a semiconductor substrate (i.e., perpendicular to a surface of the semiconductor substrate). Such a configuration may provide a small on-resistance for a given breakdown voltage and better power handling capability. Yet, many high-voltage semiconductor transistors are also designed as "lateral" transistors (i.e., a current flow is parallel with the surface of the semiconductor substrate) because lateral HV transistors can usually be fabricated with processes generally similar to those used for low-voltage (LV) devices, allowing integration of HV and LV devices to provide "integrated power" functionality.

One limitation of conventional lateral high-voltage transistors is the inability to handle high avalanche currents due, for example, to localized breakdown usually where electric fields are highest. This weakness limits the ability of lateral HV transistors to protect themselves during over-voltage conditions. Accordingly, there is a need for devices with HV transistors and integrated over-voltage protection circuits to provide improved immunity to damage during over-voltage conditions.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features.

DETAILED DESCRIPTION

Figure 1:
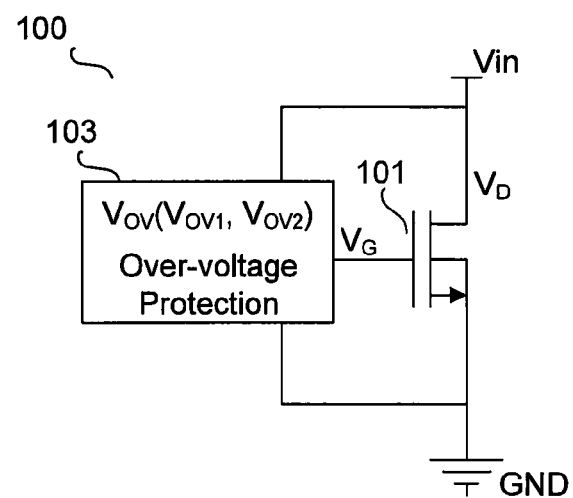
FIG. 1 is a schematic diagram of a high-voltage device comprising a high-voltage transistor and an integrated over-voltage protection circuit in accordance with an embodiment of the present disclosure.

Various embodiments of the technology will now be described. In the following description, some specific details, such as example circuits and example values for these circuit components, are included to provide a thorough understanding of embodiments. One skilled in the relevant art will recognize, however, that the technology can be practiced without one or more specific details, or with other methods, components, materials, etc. In other instances, well-known structures, materials, or operations are not shown or described in detail to avoid obscuring aspects of the technology.

The present disclosure provides a high-voltage device comprising a high-voltage transistor and an integrated over-voltage protection circuit. The over-voltage protection circuit is configured to monitor a voltage across the high-voltage transistor and to detect whether an over-voltage condition occurs. Once an over-voltage condition is detected occurring on the high-voltage transistor, the over-voltage protection circuit turns the high-voltage transistor ON. The allowable voltage across the high-voltage transistor during an over-voltage condition is lower than its breakdown voltage. In this case, when the high-voltage transistor is in over-voltage condition, the high-voltage transistor is turned ON and dissipates the power from the over-voltage event through its channel (in an ON state) rather than dissipating the power in an OFF state as an avalanche breakdown current. The ON-state current is more evenly distributed throughout the area of the high-voltage transistor, as compared to off-state avalanche current which tends to be non-uniformly distributed and tends to be concentrated in small areas near the fingertips of the high-voltage transistor. By distributing the current more uniformly, the high-voltage transistor with an integrated over-voltage protection circuit can handle more current (and, therefore, more energy) during an over-voltage condition than conventional devices. This can beneficially provide a higher rating for unclamped inductive switching (UIS), which is a common for power transistors. It can also provide a higher electrostatic discharge (ESD) rating for the high-voltage transistor.

In one embodiment, a high-voltage device comprises a high-voltage transistor having a drain terminal, a gate terminal and a source terminal. An over-voltage protection circuit is coupled between the drain terminal and the source terminal of the high-voltage transistor. The over-voltage protection circuit monitors a voltage across the high-voltage transistor to detect an over-voltage condition of the high-voltage transistor, and the over-voltage protection circuit provides a first electrical signal to the gate terminal of the high-voltage transistor to turn the high-voltage transistor ON when the over-voltage condition is detected.

In another embodiment, a high-voltage device comprises a high-voltage transistor having a first terminal, a second terminal and a control terminal and means for monitoring a voltage across the high-voltage transistor to detect whether an over-voltage condition occurs. The high-voltage device also includes means for generating a first electrical signal to the control terminal of the high-voltage transistor in response to the voltage across the high-voltage transistor. The first electrical signal turns the high-voltage transistor ON when the over-voltage condition occurs, and the first electrical signal turns the high-voltage transistor OFF when no over-voltage condition occurs.

In a further embodiment, an over-voltage protection method for a high-voltage transistor comprises monitoring a voltage across the high-voltage transistor to detect whether an over-voltage condition occurs, turning the high-voltage transistor ON when the over-voltage condition occurs, and turning the high-voltage transistor OFF when no over-voltage condition occurs.

For convenience of explanation, the present disclosure uses an N-channel lateral high-voltage transistor as an example to describe the structures and working principles of an over-voltage protection circuit and a high-voltage device. However, such an example is not intended to be limiting and persons of skill in the art will understand that the structures and principles described herein also apply to P-channel lateral high-voltage transistors, N-channel/P-channel vertical high-voltage transistors and other types of high-voltage devices.

FIG. 1 illustrates a high-voltage device 100 in accordance with an embodiment of the present disclosure. The high-voltage device 100 comprises a high-voltage transistor 101 and an over-voltage protection circuit 103. In one embodiment, the high-voltage transistor 101 has a drain terminal, a source terminal and a gate terminal. The over-voltage protection circuit 103 is configured to monitor a voltage across the high-voltage transistor 101, i.e., a voltage difference between the drain terminal and the source terminal of the high-voltage transistor 101, and to detect an over-voltage condition of the high-voltage transistor 101. The over-voltage protection circuit 103 is further configured to provide a first electrical signal indicative of an occurrence of the over-voltage condition to the gate terminal of the high-voltage transistor 101 to turn the high-voltage transistor 101 ON when the over-voltage condition occurs.

In one embodiment, the over-voltage protection circuit 103 comprises a voltage detection circuit and an over-voltage determination circuit. The voltage detection circuit is configured to monitor the voltage across the high-voltage transistor 101 and to provide a second electrical signal indicative of the voltage across the high-voltage transistor 101. The over-voltage determination circuit is configured to receive the second electrical signal, and to compare the second electrical signal to an over-voltage threshold to provide the first electrical signal to the gate terminal of the high-voltage transistor 101. The first electrical signal turns the high-voltage transistor ON when the second electrical signal is higher than the over-voltage threshold; and the first electrical signal turns the high-voltage transistor OFF when the second electrical signal is lower than the over-voltage threshold.

In one embodiment, the over-voltage threshold comprises a first over-voltage threshold and a second over-voltage threshold. When the second electrical signal is higher than the first over-voltage threshold, the first electrical signal turns the high-voltage transistor ON; and when the second electrical signal is lower than the second over-voltage threshold, the first electrical signal turns the high-voltage transistor OFF.

In the example of FIG. 1, the high-voltage transistor 101 comprises an N-channel high-voltage transistor, and has a drain terminal coupled to the input power supply Vin, a source terminal connected to ground GND and a gate terminal coupled to the over-voltage protection circuit 103. The over-voltage protection circuit 103 is configured to monitor a drain voltage VD of the high-voltage transistor 101 and to provide a first electrical signal VG indicative of an occurrence of an over-voltage condition to the gate terminal of the high-voltage transistor 101. In one embodiment, the over-voltage protection circuit 103 monitors the drain voltage VD and generates a second electrical signal indicative of the drain voltage VD. The over-voltage protection circuit 103 further compares the second electrical signal with a target over-voltage threshold VOV to provide the first electrical signal VG to the gate terminal of the high-voltage transistor 101.

In one embodiment, the over-voltage threshold VOV comprises a first over-voltage threshold VOV1 and a second over-voltage threshold VOV2. When the over-voltage protection circuit 103 detects that the second electrical signal exceeds the first over-voltage threshold VOV1, the second electrical signal VG causes the high-voltage transistor 101 to be turned ON. In consequence, the high-voltage transistor 101 in its ON state discharges current from the input power supply Vin and the drain voltage VD decreases. When the over-voltage protection circuit 103 detects that the drain voltage VD falls below a certain level causing the second electrical signal to be lower than the second over-voltage threshold VOV2, the first electrical signal VG causes the high-voltage transistor 101 to be turned OFF.

In one embodiment, the first over-voltage threshold VOV1 and the second over-voltage threshold VOV2 have the same value, so that the high-voltage transistor 101 is turned ON and OFF at the same drain voltage no matter if the drain voltage is rising or falling. In another embodiment, the first over-voltage threshold VOV1 is higher than the second over-voltage threshold VOV2 to provide hysteresis.

In accordance with various embodiments of the present disclosure, the over-voltage protection circuit 103 can include suitable circuitry that is capable to sustain high voltages from the input power supply Vin, to detect the voltage across the high-voltage transistor 101 and to provide a control signal to the gate terminal of the high-voltage transistor 101 according to the detected voltage across the high-voltage transistor 101. When the voltage across the high-voltage transistor 101 is higher than a first over-voltage threshold, the control signal causes the high-voltage transistor 101 to be turned ON; and when the voltage across the high-voltage transistor 101 is lower than a second over-voltage threshold, the control signal causes the high-voltage transistor 101 to be turned OFF.

Figure 2:
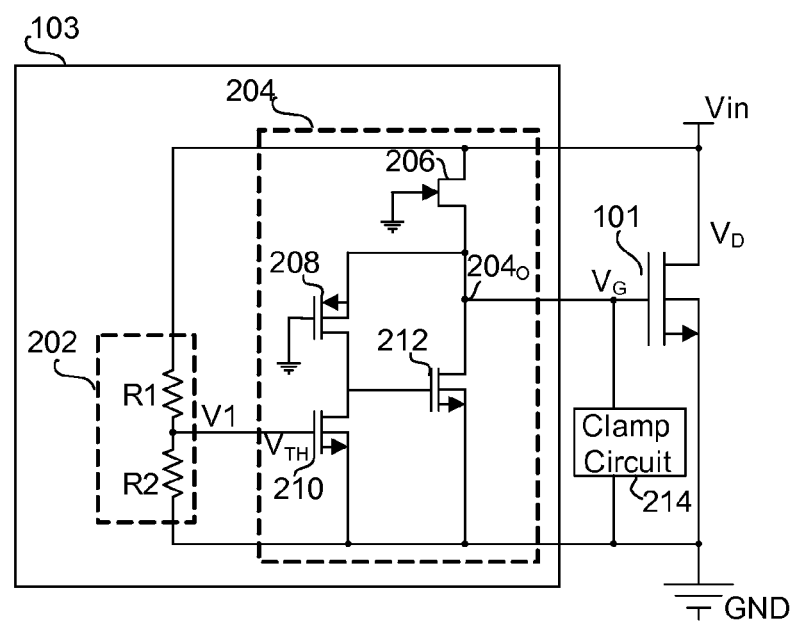
FIG. 2 is a schematic diagram of a high-voltage device comprising a high-voltage transistor and an integrated over-voltage protection circuit in accordance with an embodiment of the present disclosure.

FIG. 2 illustrates a high-voltage device including an over-voltage protection circuit 103 in accordance with an embodiment of the present disclosure. In the example of FIG. 2, the over-voltage protection circuit 103 comprises a voltage detection circuit 202 and an over-voltage determination circuit 204. The voltage detection circuit 202 is coupled between the drain terminal and the source terminal of the high-voltage transistor 101. The voltage detection circuit 202 monitors the drain voltage VD of the high-voltage transistor 101 and generates a first electrical signal V1 that is indicative of the drain voltage VD. The first electrical signal V1 is provided to the over-voltage determination circuit 204.

Figure 4:
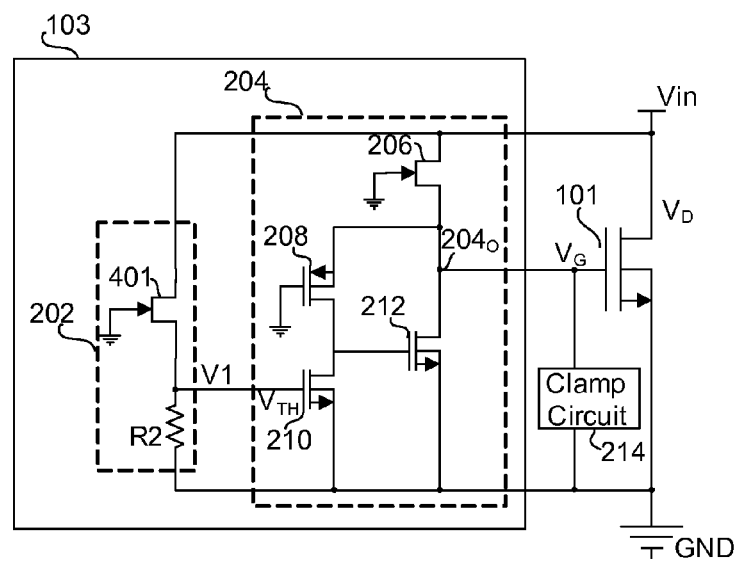
FIG. 4 is a schematic diagram of a high-voltage device comprising a high-voltage transistor and an integrated over-voltage protection circuit in accordance with an alternative embodiment of the present disclosure.

In one embodiment, the voltage detection circuit 202 comprises a resistor divider comprising a first resistor R1 and a second resistor R2 coupled in series between the drain terminal and the source terminal of the high-voltage transistor 101. The voltage across the second resistor R2 is provided as the first electrical signal V1. In certain embodiments, relatively high resistances of the resistors R1 and R2 may be chosen to limit the amount of current drawn from Vin during normal operation (i.e., not during an over-voltage condition). In other embodiments, a high-voltage transistor may be used in the voltage detection circuit 202. For example, as illustrated in FIG. 4, R1 in FIG. 2 may be replaced by a normally-ON high-voltage transistor 401 such as a JFET or a depletion-mode MOSFET.

Continuing with FIG. 2, the over-voltage determination circuit 204 is coupled between the input power supply Vin and ground GND. The over-voltage determination circuit 204 receives the first electrical signal V1, and compares it with one or more over-voltage thresholds to output a second electrical signal VG to the gate of the high-voltage transistor 101. In one embodiment, the over-voltage determination circuit 204 comprises a normally-ON high-voltage transistor 206 such that the over-voltage determination circuit is "self-powered" by the drain voltage VD of the high-voltage transistor 101. This obviates the need for a separate power supply and allows the over-voltage protection to work even when power is applied only to Vin (e.g., in an ESD event).

The over-voltage determination circuit 204 further comprises active circuitry that is powered by Vin via transistor 206. In the embodiment shown in FIG. 2, the active circuitry comprises a first normally-ON low-voltage transistor 208, a normally-OFF low-voltage transistor 210 and a second normally-ON low-voltage transistor 212. In the example of FIG. 2, the normally-ON high-voltage transistor 206 comprises a high-voltage junction field effect transistor ("HVJFET"), the first normally-ON low-voltage transistor 208 comprises a low-voltage P channel metal oxide semiconductor transistor ("LVPMOS"), the normally-OFF low-voltage transistor 210 comprises a low-voltage N channel metal oxide semiconductor transistors ("LVNMOS"), and the second normally-ON low-voltage transistors 212 comprises a low-voltage N channel metal oxide semiconductor transistor ("LVNMOS").

In the embodiment shown in FIG. 2, the drain of the high-voltage transistor 206 is coupled to the input power supply Vin or to the drain of the high-voltage transistor 101, while the gate is coupled to ground GND and the source is coupled to the source of the first normally-ON low-voltage transistor 208, and to the drain of the second normally-ON low-voltage transistor 212 to form an output node 204O. The gate of the first normally-ON low-voltage transistor 208 is connected to a ground and the drain of the first normally-ON low-voltage transistor 208 is coupled to the drain of the normally-OFF low-voltage transistor 210 and to the gate of the second normally-ON low-voltage transistor 212 such that the transistor 208 provides a generally continuous pull-up current to the gate of the transistor 212. The source of the normally-OFF low-voltage transistor 210 and the source of the second normally-ON low-voltage transistor 212 are connected to ground GND. The gate of the normally-OFF low-voltage transistor 210 is coupled to the drain voltage detection circuit 202 to receive the first electrical signal V1. The output node 204O is coupled to the gate of the high-voltage transistor 101.

In one embodiment, the normally-OFF low-voltage transistor 210 has a turn-ON threshold voltage VTH. The ratio of the first resistor R1 and the second resistor R2 of the resistor divider is chosen such that the first electrical signal V1 is substantially equal to VTH of transistor 210 when the drain voltage VD of the high-voltage transistor 101 exceeds a target over-voltage threshold. During operation of the high-voltage device, when the first electrical signal V1 exceeds the threshold voltage VTH of the first normally-OFF low-voltage transistor 210, i.e., the drain voltage VD of the high-voltage transistor 101 exceeds the target over-voltage threshold, the first normally-OFF low-voltage transistor 210 is turned ON to overcome the first normally-ON low-voltage transistor 208, such that the gate of the second normally-ON low-voltage transistor 212 is pulled down, and the second normally-ON low-voltage transistor 212 is turned OFF. With the second normally-ON low-voltage transistor 212 turned OFF, a current supplied from the input power supply Vin through normally-ON high-voltage transistor 206 charges the gate of the high-voltage transistor 101 until the second electrical signal VG is high enough to turn the high-voltage transistor 101ON. Then the high-voltage transistor 101 in its ON state pulls current from the input power supply Vin to ground GND until the drain voltage VD of the high-voltage transistor 101 decreases below the target over-voltage threshold.

When the drain voltage VD of the high-voltage transistor 101 falls below the target over-voltage threshold, the first electrical signal V1 from the voltage detection circuit 202 becomes lower than the threshold VTH of the normally-OFF low-voltage transistor 210, resulting in the low-voltage transistor 210 being turned OFF. Consequently, a current through the first normally-ON low-voltage transistor 208 charges the gate of the second normally-ON low-voltage transistor 212, which turns the second normally-ON low-voltage transistor 212 ON again. With the second normally-ON low-voltage transistor 212 turned ON, the gate of the high-voltage transistor 101 is discharged and the second electrical signal VG decreases. When the second electrical signal is low enough, it turns the high-voltage transistor 101 OFF.

Although the circuit of FIG. 2 provides only a single over-voltage threshold VTH, other embodiments of this technology may include additional circuitry to provide two different over-voltage thresholds, i.e., a drain voltage-rising threshold and a drain voltage-falling threshold with hysteresis between the voltage-rising and the voltage-falling thresholds. In further embodiments, other embodiments of this technology may include suitable circuitry to provide three, four, and/or other suitable number of over-voltage thresholds.

In one embodiment, during charging the gate of the high-voltage transistor 101, the maximum voltage at the gate terminal is limited by a pinch-off voltage of the normally-ON high-voltage transistor 206, i.e., a pinch-off voltage of the high voltage JFET in the example shown in FIG. 2. In one embodiment, the maximum voltage charged at the gate terminal of the high-voltage transistor 101 is clamped by a clamp circuit, e.g., a Zener diode coupled between the output node 204O and ground (not shown). In one embodiment, the high-voltage transistor 101 comprises a poly-spiral field plate over its drift region, and the poly spiral field plate comprises a resistor that is used to form the resistor divider of the drain voltage detection circuit 202. In other embodiments, the high-voltage transistor 101 can include other suitable configurations.

In accordance with an embodiment of the present disclosure, a high-voltage device comprises a high-voltage transistor having a first terminal, a second terminal and a control terminal; means for monitoring a voltage across the high-voltage transistor to detect whether an over-voltage condition occurs; and means for generating a first electrical signal to the control terminal of the high-voltage transistor in response to the voltage across the high-voltage transistor. The first electrical signal turns the high-voltage transistor ON when the over-voltage condition occurs; and the first electrical signal turns the high-voltage transistor OFF when no over-voltage condition occurs. In one embodiment, the high-voltage transistor conducts a current from the first terminal to the second terminal when it is turned ON, and the high-voltage transistor does not conduct a current when is turned OFF.

In one embodiment, means for monitoring the voltage across the high-voltage transistor comprises a voltage divider configured to generate a second electrical signal indicative of the voltage across the high-voltage transistor; and means for generating the first electrical signal comprises means for comparing the second electrical signal with an over-voltage threshold to provide the first electrical signal. The first electrical signal turns the high-voltage transistor ON when the first electrical signal is higher than the over-voltage threshold; and the first electrical signal turns the high-voltage transistor OFF when the second electrical signal is lower than the over-voltage threshold. In other embodiments, the means for monitoring and the means for generating can include other suitable circuits and/or configurations.

In one embodiment, the over-voltage threshold comprises a first over-voltage threshold and a second over-voltage threshold. The first electrical signal turns the high-voltage transistor ON when the second electrical signal is higher than the first over-voltage threshold; and the first electrical signal turns the high-voltage transistor OFF when the second electrical signal is lower than the second over-voltage threshold.

In one embodiment, the means for generating the first electrical signal further comprises a normally-ON high-voltage transistor coupled to the first terminal of the high-voltage transistor, wherein the normally-ON high-voltage transistor provides a current from the first terminal of the high-voltage transistor to power the means for generating the first electrical signal. In one embodiment, the high-voltage transistor comprises an N-type high-voltage transistor or a P-type high-voltage transistor.

Figure 3:
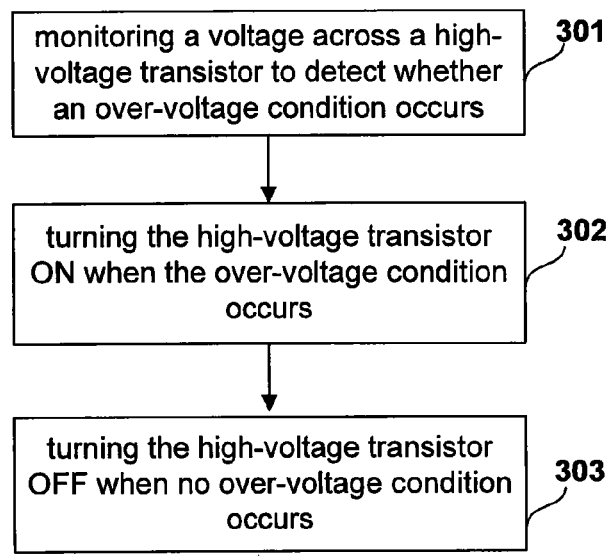
FIG. 3 is a flow chart illustrating an over-voltage protection method for a high-voltage transistor in accordance with an embodiment of the present disclosure.

FIG. 3 shows a flow chart illustrating an over-voltage protection method for a high-voltage transistor in accordance with an embodiment of the present disclosure. The over-voltage protection method comprises: at stage 301, monitoring a voltage across the high-voltage transistor to detect whether an over-voltage condition occurs; at stage 302, turning the high-voltage transistor ON when the over-voltage condition occurs; and at stage 303, turning the high-voltage transistor OFF when no over-voltage condition occurs.

In one embodiment, stage 301 further comprises detecting the voltage across the high-voltage transistor to provide a first electrical signal indicative of the voltage across the high-voltage transistor; and comparing the first electrical signal with an over-voltage threshold. When the first electrical signal is higher than the over-voltage threshold, the over-voltage condition is indicated; when the first electrical signal is lower than the over-voltage threshold, no over-voltage condition is indicated.

In one embodiment, stage 301 further comprises detecting the voltage across the high-voltage transistor to provide a first electrical signal indicative of the voltage across the high-voltage transistor; and comparing the first electrical signal with a first over-voltage threshold. When the first electrical signal is higher than the first over-voltage threshold, the over-voltage condition is indicated; and comparing the first electrical signal with a second over-voltage threshold, when the first electrical signal is lower than the second over-voltage threshold, no over-voltage condition is indicated.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:

1. A high-voltage device, comprising:
a high-voltage transistor having a drain terminal, a gate terminal, and a source terminal; and
an over-voltage protection circuit coupled between the drain terminal and the source terminal of the high-voltage transistor, wherein the over-voltage protection circuit is configured to monitor a voltage across the high-voltage transistor, to detect an over-voltage condition of the high-voltage transistor, and to provide a first electrical signal to the gate terminal of the high-voltage transistor to turn the high-voltage transistor ON when the over-voltage condition is detected; wherein, the over-voltage protection circuit comprises:
a voltage detection circuit configured to monitor the voltage across the high-voltage transistor to generate a second electrical signal indicative of the voltage across the high-voltage transistor; and
an over-voltage determination circuit configured to receive the second electrical signal and to compare the second electrical signal with an over-voltage threshold to provide the first electrical signal to the gate terminal of the high-voltage transistor, wherein the first electrical signal turns the high-voltage transistor ON when the second electrical signal is higher than the over-voltage threshold, and wherein the first electrical signal turns the high-voltage transistor OFF when the second electrical signal is lower than the over-voltage threshold.

2. The high-voltage device of claim 1, wherein:
the over-voltage threshold comprises a first over-voltage threshold and a second over-voltage threshold;
the first electrical signal turns the high-voltage transistor ON when the second electrical signal is higher than the first over-voltage threshold; and
the first electrical signal turns the high-voltage transistor OFF when the second electrical signal is lower than the second over-voltage threshold.

3. The high-voltage device of claim 1, wherein the voltage detection circuit comprises a voltage divider comprising:
a first resistor having a first terminal and a second terminal, wherein the first terminal is coupled to the drain terminal of the high-voltage transistor; and
a second resistor having a first terminal and a second terminal, wherein the first terminal of the second resistor is coupled to the second terminal of the first resistor, and the second terminal of the second resistor is coupled to the source terminal of the high-voltage transistor, and wherein the second electrical signal is provided at the first terminal of the second resistor.

4. The high-voltage device of claim 1, wherein the voltage detection circuit comprises a voltage divider comprising:
a first normally-ON high-voltage transistor having a drain terminal, a source terminal, and a gate terminal, wherein the drain terminal is coupled to the drain terminal of the high-voltage transistor and the gate terminal is coupled to ground; and
a resistor having a first terminal and a second terminal, wherein the first terminal is coupled to the source terminal of the first normally-ON high-voltage transistor and the second terminal is coupled to the source terminal of the high-voltage transistor, wherein the second electrical signal is provided at the first terminal of the resistor.

5. The high-voltage device of claim 4, wherein the over-voltage determination circuit further comprises: a first normally-ON low-voltage transistor, a normally-OFF low-voltage transistor and a second normally-ON low-voltage transistor, each of which having a drain terminal, a gate terminal and a source terminal, and wherein:
the drain terminal of the second normally-ON high-voltage transistor is coupled to the drain terminal of the high-voltage transistor, the gate terminal is coupled to ground and the source terminal is coupled to the source terminal of the first normally-ON low-voltage transistor and to the drain terminal of the second normally-ON low-voltage transistor to form an output node;
the gate terminal of the first normally-ON low-voltage transistor is coupled to ground, and the drain terminal is coupled to the drain terminal of the normally-OFF low-voltage transistor and to the gate terminal of the second normally-ON low-voltage transistor;
the source terminal of the normally-OFF low-voltage transistor and the source of the second normally-ON low-voltage transistor are connected to ground;
the gate terminal of the normally-OFF low-voltage transistor is coupled to the voltage detection circuit to receive the first electrical signal; and the output node is coupled to the gate terminal of the high-voltage transistor.

6. The high-voltage device of claim 5, wherein a voltage at the gate terminal of the high-voltage transistor is limited by a pinch-off voltage of the second normally-ON high-voltage transistor.

7. The high-voltage device of claim 5, wherein the over-voltage determination circuit further comprises a clamp circuit coupled between the output node and ground to limit a voltage at the gate terminal of the high-voltage transistor.

8. The high-voltage device of claim 1, wherein the over-voltage determination circuit comprises a second normally-ON high-voltage transistor having a drain terminal, a gate terminal, and a source terminal, and wherein the second normally-ON high-voltage transistor is coupled to the drain terminal of the high-voltage transistor, and is configured to provide a current from the drain terminal of the high-voltage transistor to power the over-voltage determination circuit.

9. A high-voltage device, comprising:
a high-voltage transistor having a first terminal, a second terminal, and a control terminal;
means for monitoring a voltage across the high-voltage transistor to generate a second electrical signal indicative of the voltage across the high-voltage transistor to detect whether an over-voltage condition occurs; and
means for generating a first electrical signal to the control terminal of the high-voltage transistor in response to the second electrical signal, wherein the first electrical signal turns the high-voltage transistor ON when the over-voltage condition occurs; and the first electrical signal turns the high-voltage transistor OFF when no over-voltage condition occurs; and wherein
means for generating the first electrical signal comprises means for comparing the second electrical signal with an over-voltage threshold to provide the first electrical signal, wherein the first electrical signal turns the high-voltage transistor ON when the first electrical signal is higher than the over-voltage threshold; and the first electrical signal turns the high-voltage transistor OFF when the second electrical signal is lower than the over-voltage threshold.

10. The high-voltage device of claim 9, wherein:
means for monitoring the voltage across the high-voltage transistor comprises a voltage divider configured to generate second electrical signal indicative of the voltage across the high-voltage transistor.

11. The high-voltage device of claim 9, wherein the over-voltage threshold comprises a first over-voltage threshold and a second over-voltage threshold; and wherein:
the first electrical signal turns the high-voltage transistor ON when the second electrical signal is higher than the first over-voltage threshold; and
the first electrical signal turns the high-voltage transistor OFF when the second electrical signal is lower than the second over-voltage threshold.

12. The high-voltage device of claim 9, wherein the means for generating the first electrical signal further comprises: a normally-ON high-voltage transistor coupled to the first terminal of the high-voltage transistor, and wherein the normally-ON high-voltage transistor provides a current from the first terminal of the high-voltage transistor to power the means for generating the first electrical signal.

13. The high-voltage device of claim 9, wherein the high-voltage transistor comprises an N-type high-voltage transistor or a P-type high-voltage transistor.

14. An over-voltage protection method for a high-voltage transistor, comprising:
monitoring a voltage across the high-voltage transistor to detect whether an over-voltage condition occurs;
turning the high-voltage transistor ON when the over-voltage condition occurs; and turning the high-voltage transistor OFF when no over-voltage condition occurs;
wherein monitoring the voltage across the high-voltage transistor comprises:
detecting the voltage across the high-voltage transistor to provide a first electrical signal indicative of the voltage across the high-voltage transistor; and
comparing the first electrical signal with an over-voltage threshold, when the first electrical signal is higher than the over-voltage threshold, the over-voltage condition occurs; when the first electrical signal is lower than the over-voltage threshold, no over-voltage condition occurs.

15. The over-voltage protection method of claim 14, wherein comparing the first electrical signal with the over-voltage threshold comprises:
comparing the first electrical signal with a first over-voltage threshold, when the first electrical signal is higher than the first over-voltage threshold, the over-voltage condition occurs; and
comparing the first electrical signal with a second over-voltage threshold, when the first electrical signal is lower than the second over-voltage threshold, no over-voltage condition occurs.

* * * * *